(12) United States Patent
Wu et al.

(10) Patent No.: US 12,257,612 B2
(45) Date of Patent: Mar. 25, 2025

(54) PARTICLE REMOVING ASSEMBLY AND METHOD OF SERVICING ASSEMBLY

(71) Applicant: TAIWAN SEMICONDUCTOR MANUFACTURING COMPANY, LTD., Hsinchu (TW)

(72) Inventors: Meng-Hsueh Wu, Hsinchu (TW); Fang Yu Kuo, Hsinchu (TW); Kai Yu Liu, Hsinchu (TW); Yu-Chun Wu, Hsinchu (TW); Jau-Sheng Huang, Hsinchu (TW); Wei-Yi Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/224,520

(22) Filed: Jul. 20, 2023

(65) Prior Publication Data
US 2024/0001414 A1 Jan. 4, 2024

Related U.S. Application Data

(62) Division of application No. 17/132,940, filed on Dec. 23, 2020, now Pat. No. 11,779,967.

(60) Provisional application No. 62/982,723, filed on Feb. 27, 2020.

(51) Int. Cl.
*B08B 9/08* (2006.01)
*H01L 21/67* (2006.01)

(52) U.S. Cl.
CPC ...... *B08B 9/0813* (2013.01); *H01L 21/67051* (2013.01)

(58) Field of Classification Search
CPC ............... B08B 9/0813; H01L 21/67051
See application file for complete search history.

(56) References Cited

U.S. PATENT DOCUMENTS

| | | | |
|---|---|---|---|
| 5,865,901 A * | 2/1999 | Yin | B08B 3/00 |
| | | | 451/39 |
| 9,919,350 B2 | 3/2018 | Tseng et al. | |
| 2016/0276207 A1 | 9/2016 | Tseng et al. | |

FOREIGN PATENT DOCUMENTS

| | | | | |
|---|---|---|---|---|
| KR | 20010049817 A | * | 6/2001 | ....... H01L 21/67034 |
| KR | 100644212 B1 | * | 11/2006 | ............. B05B 15/68 |

(Continued)

OTHER PUBLICATIONS

KR 100644212 B1 (machine translation) (Year: 2006).*

(Continued)

*Primary Examiner* — Andrew A Horton
(74) *Attorney, Agent, or Firm* — STUDEBAKER BRACKETT PLLC

(57) ABSTRACT

An apparatus includes a wafer stage and a particle removing assembly. The wafer stage includes a cup adjacent to a wafer chuck. The particle removing assembly is configured to remove contaminant particles from the cup. In some embodiments, the particle removing assembly comprises a flexible ejecting member that includes one or more elongated tubes, a front tip, and a cleaning tip adapter configured to attach the front tip to each of the one or more elongated tubes. The front tip includes front openings and lateral openings from which pressurized cleaning material are introduced onto an unreachable area of the cup to remove the contaminant particles from the cup.

20 Claims, 16 Drawing Sheets

(56) References Cited

FOREIGN PATENT DOCUMENTS

| KR | 101049441 B1 | * | 7/2011 | ....... | H01L 21/67034 |
| KR | 20180097371 A | * | 8/2018 | ....... | H01L 21/02307 |

OTHER PUBLICATIONS

KR 20010049817 A (machine translation) (Year: 2001).*
KR 20180097371 A (machine translation) (Year: 2018).*
KR 101049441 B1 (machine translation) (Year: 2011).*
Notice of Allowance issued in U.S. Appl. No. 17/132,940, dated Jun. 9, 2023.

* cited by examiner

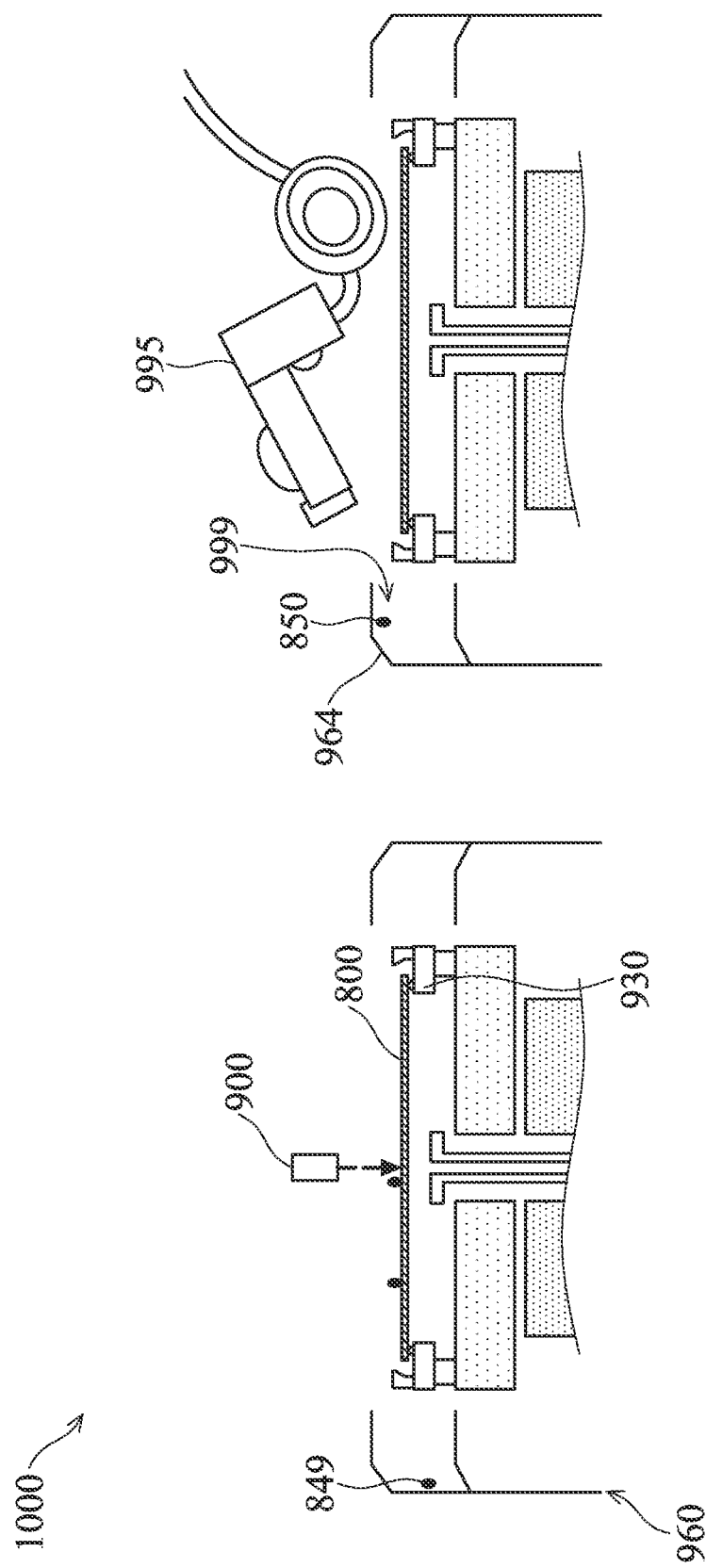

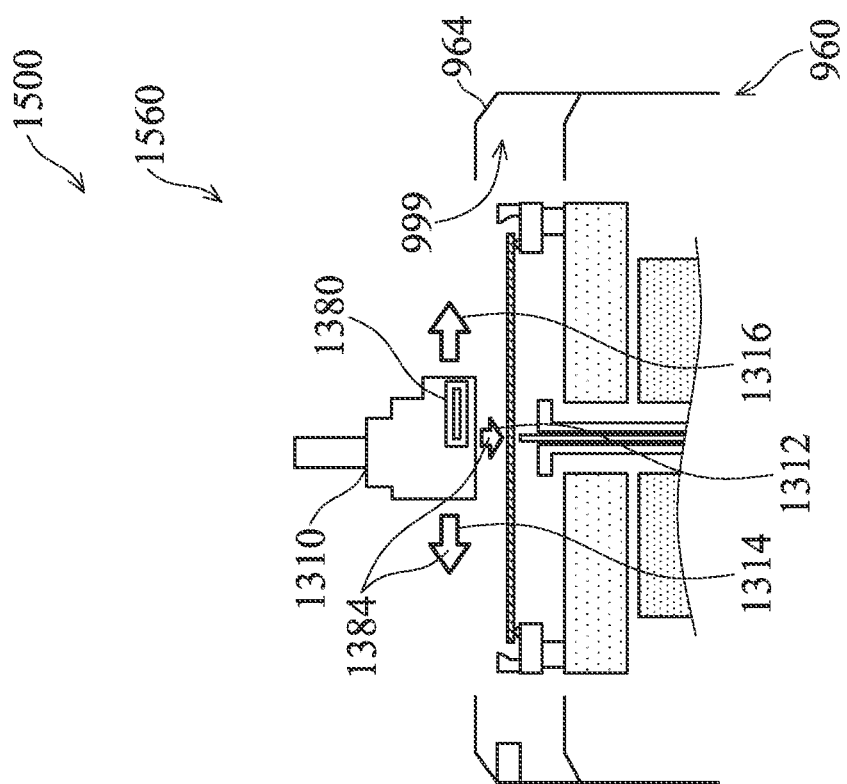
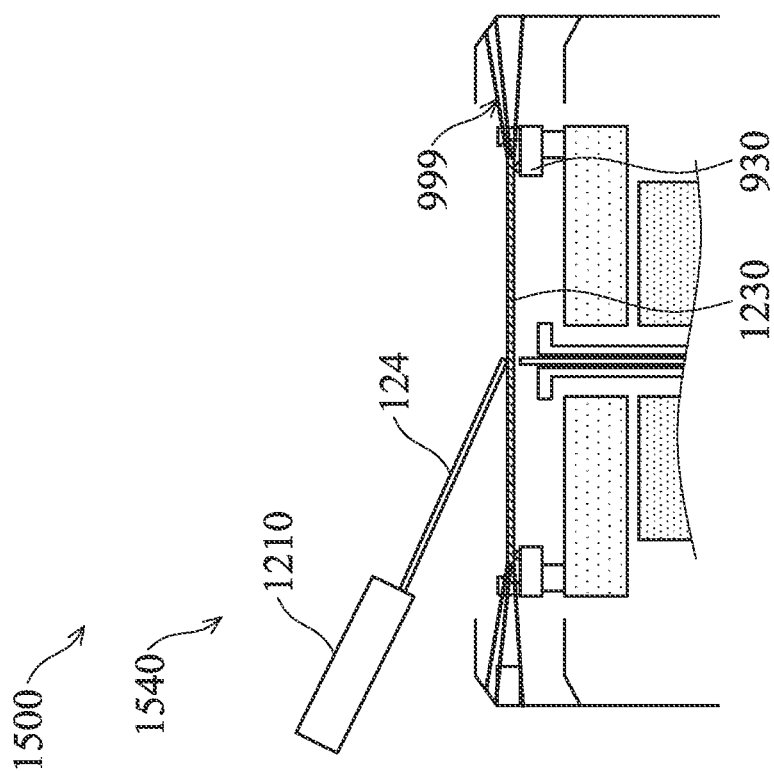
FIG. 7B
FIG. 7A

PARTICLE REMOVING ASSEMBLY AND METHOD OF SERVICING ASSEMBLY

RELATED APPLICATIONS

This application is a divisional of U.S. patent application Ser. No. 17/132,940 filed on Dec. 23, 2020, entitled "Particle Removing Assembly and Method of Serving Assembly," which claims priority of U.S. Provisional Application No. 62/982,723 filed on Feb. 27, 2020, the entire contents of which are incorporated herein by reference.

BACKGROUND

In a semiconductor manufacturing process, particles and/or contamination can reduce the yield of manufactured semiconductor devices by undesirably shielding portions of a wafer. It is, therefore, desirable to maintain a clean environment in locations where the wafer passes through during the manufacturing process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B schematically illustrate cup-wash devices in accordance with some embodiments of the disclosure.

FIGS. 7A, 7B and 7C schematically illustrate an automatic cup-cleaning operation including rinsing and drying processes according to an embodiment of the disclosure.

DETAILED DESCRIPTION

Figure 2A:
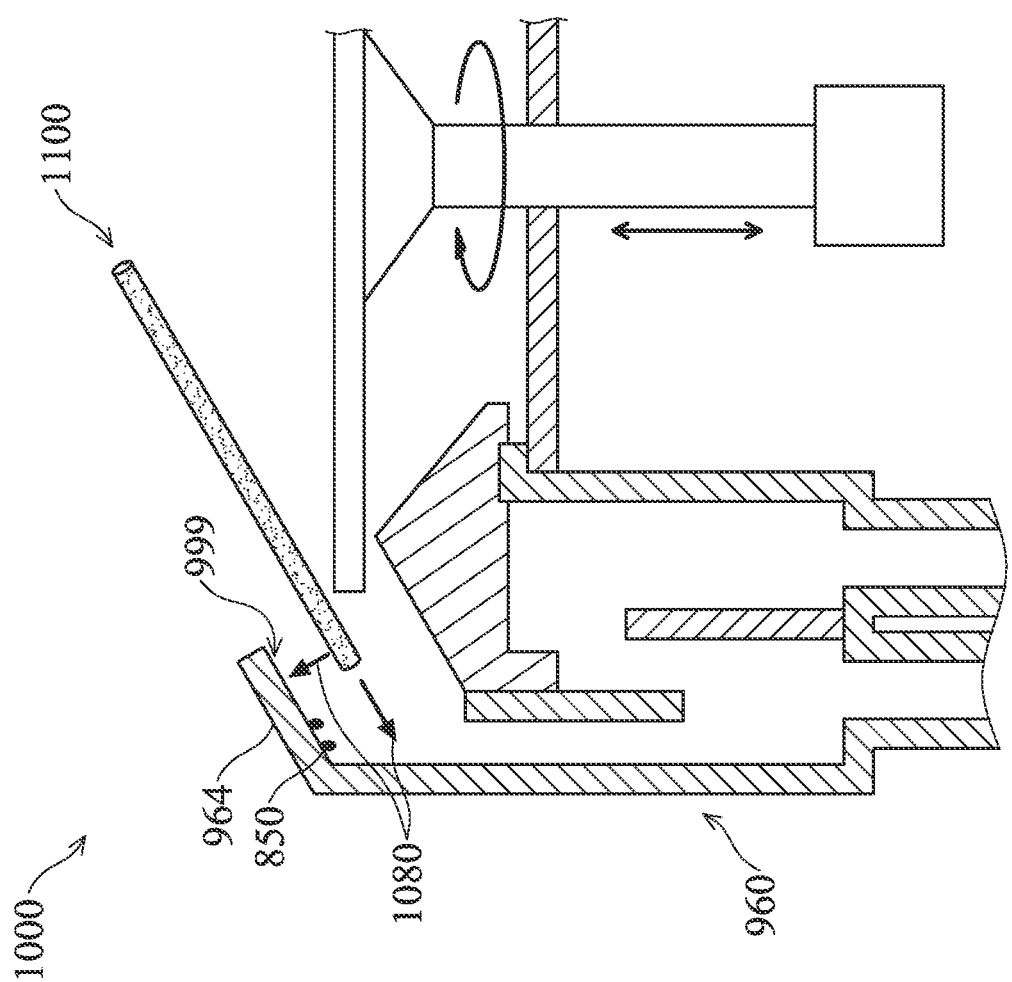
FIGS. 2A and 2B schematically illustrate a flexible ejecting member according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure relates to a contaminant particle removing assembly that is designed to remove contaminants from a cup or shroud used in a wet process apparatus to improve cleanliness of a semiconductor wafer manufacturing process. In some embodiments, the wet process apparatus includes a photo resist coater, a photo resist developer, a wet etching apparatus, and a wet cleaning apparatus, in which a solution is applied to the surface of rotating wafer.

FIGS. 1A and 1B schematically illustrate methods of cleaning a cup of a wet process apparatus used for a semiconductor wafer manufacturing process, which includes a cup 960 and a particle removing assembly 1000, according to embodiments of the disclosure. A dispensing nozzle 900 may be used to eject a processing solution onto the wafer 800, while the wafer chuck 930 rotates the wafer 800. In some embodiments, the wafer chuck 930 holds a peripheral edge of the wafer 800 as shown in FIGS. 1A and 1B. In some embodiments, the processing solution is photo resist, developer, wet etchant or wet cleaning solution. During a resist coating process, a resist developing process, a wet etching process and/or a wet cleaning process, most of the contaminant material 849 (e.g., a photo resist, etching by-products, particles, etc.), as shown in FIG. 1A, which was on or adhered to the surface of the wafer 800, is removed from the wafer 800, and is directed to a drain of the apparatus. However, some contaminant material 850 may be deposited on an unreachable dead zone 999 of the cup 960 and adhere to the inner surface on the curved portion 964 of the cup 960. The unreachable dead zone 999 of the cup 960 is an area or a zone not reachable by conventional cup cleaning devices.

In some embodiments, the contaminant material 850 is a photo resist, an organic bottom antireflective coating material, a top coat material, a developer such as tetramethylammonium hydroxide (TMAH) or an organic solvent. In other embodiments, the contaminant material includes process chemicals, such as an acid (e.g., HF, BHF, HCl, $H_2SO_4$, $HNO_3$, $H_3PO_4$, etc); an alkaline (e.g., KOH, etc.); any solutions used in the semiconductor manufacturing process; or mixtures thereof.

Figure 2B:
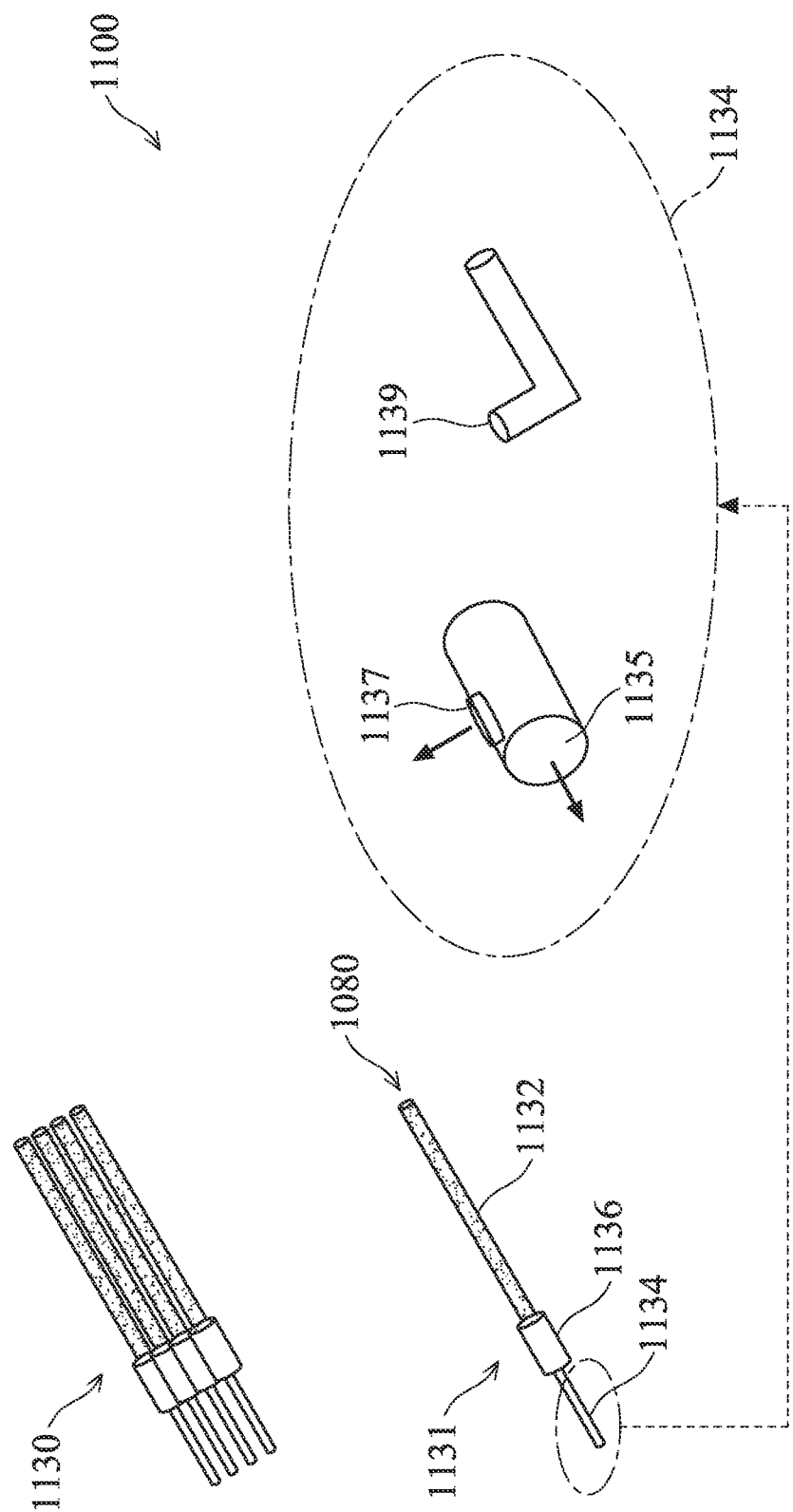

As shown in FIG. 1B, in some embodiments, various types of manual cleaning devices 995 may be used to clean the inner surface of the curved portion of the cup. However, due to various sizes and configurations of the manual cleaning devices 995, it may be insufficient to completely remove the contaminant materials 850 adhered to the curved portion 964 of the cup 960. In some embodiments, due to an inclined/curved shape, the contaminant material 850 adhered to the curved portion 964 may be more likely to fall back on the wafer 800. According to an embodiment of the disclosure, a particle removing assembly 1000 as shown in FIGS. 2A and 2B is provided for cleaning the cup. The particle removing assembly 1000 is configured to remove contaminant particles from locations where it is difficult or near impossible to reach by the manual cleaning devices 995, such as the unreachable dead zone 999 of the cup.

As shown in FIGS. 2A and 2B, in an embodiment according to this disclosure, the particle removing assembly 1000 includes a flexible ejecting member 1100 from which pressurized cleaning material 1080 is introduced onto the unreachable dead zone 999 in the curved portion 964 of the cup 960 to remove the contaminant material 850 from the unreachable dead zone 999 of the cup 960. The flexible ejecting member 1100, as shown in FIG. 2B, includes an elongated tube unit 1131 and an elongated tube assembly 1130. The elongated tube assembly 1130 includes two or more elongated tube units 1131. The elongated tube unit 1131 includes a front tip 1134, and a cleaning tip adapter 1136 configured to attach the front tip to an elongated tube body 1132. The flexible ejecting member 1100, according to embodiments of the disclosure, is made of PE (polyethylene) or PTFE (polytetrafluoroethylene). In some embodiments, the flexible ejecting member 1100 is made of an elastic material to reach and clean the unreachable dead zone 999 of the cup 960. Examples of the elastic material forming the elongated tube assembly 1130 include crosslinked rubber materials such as silicone rubber, chloroprene rubber, EPDM, NBR, natural rubber, and fluororubber. In some embodiments, some examples of the silicone rubber include (meth) acryloyloxy group-containing polysiloxane, vinyl polysiloxane, mercaptoalkyl group-containing polysiloxane, and the like.

In some embodiments, the front tip 1134 is detachable from the elongated tube body 1132. The cleaning tip adapter 1136 connects the front tip 1134 and the elongated tube body 1132 together. In some embodiments, the elongated tube unit 1131 is monolithic unit including the front tip 1134 fixedly attached or integrated with the elongated tube body 1132. In some embodiments, the front tip 1134 of the elongated tube units 1131 has a diameter in a range of about 2.9 mm to about 5.0 mm. In some embodiments, the elongated tube assembly 1130 include about 3 to about 9 elongated tube units 1131 depending on the design of the elongated tube assembly 1130 and the cleaning needs associated with the unreachable dead zone 999 in various embodiments. In some embodiments, the number of elongated tubes is greater than 9 or less than 3.

As shown in FIG. 2B, the flexible ejecting member 1100 includes the front tip 1134, which includes front openings 1135 and/or lateral openings 1137 that are configured to eject the pressurized cleaning material. In some embodiments, the lateral openings 1137 have a diameter in a range of between about 0.1 mm and about 2 mm. In some embodiments, no front opening is provided (closed) in the front tip 1134, and in other embodiments, no lateral opening is provided (closed) in the front tip 1134. In some embodiments, the flexible ejecting member 1100 includes an L-shaped front tip 1139. In some embodiments, the flexible ejecting member 1100 includes both the straight shape front tip and the L-shape front tip, which are, for example, alternately arranged.

In some embodiments, the front tip 1134 and the cleaning tip adapter 1136 may be fixedly attached or integrated with the elongated tube body 1132. In alternative embodiments, the front tip 1134 and the cleaning tip adapter 1136 may be detachable from the elongated tube body 1132.

Figure 3:
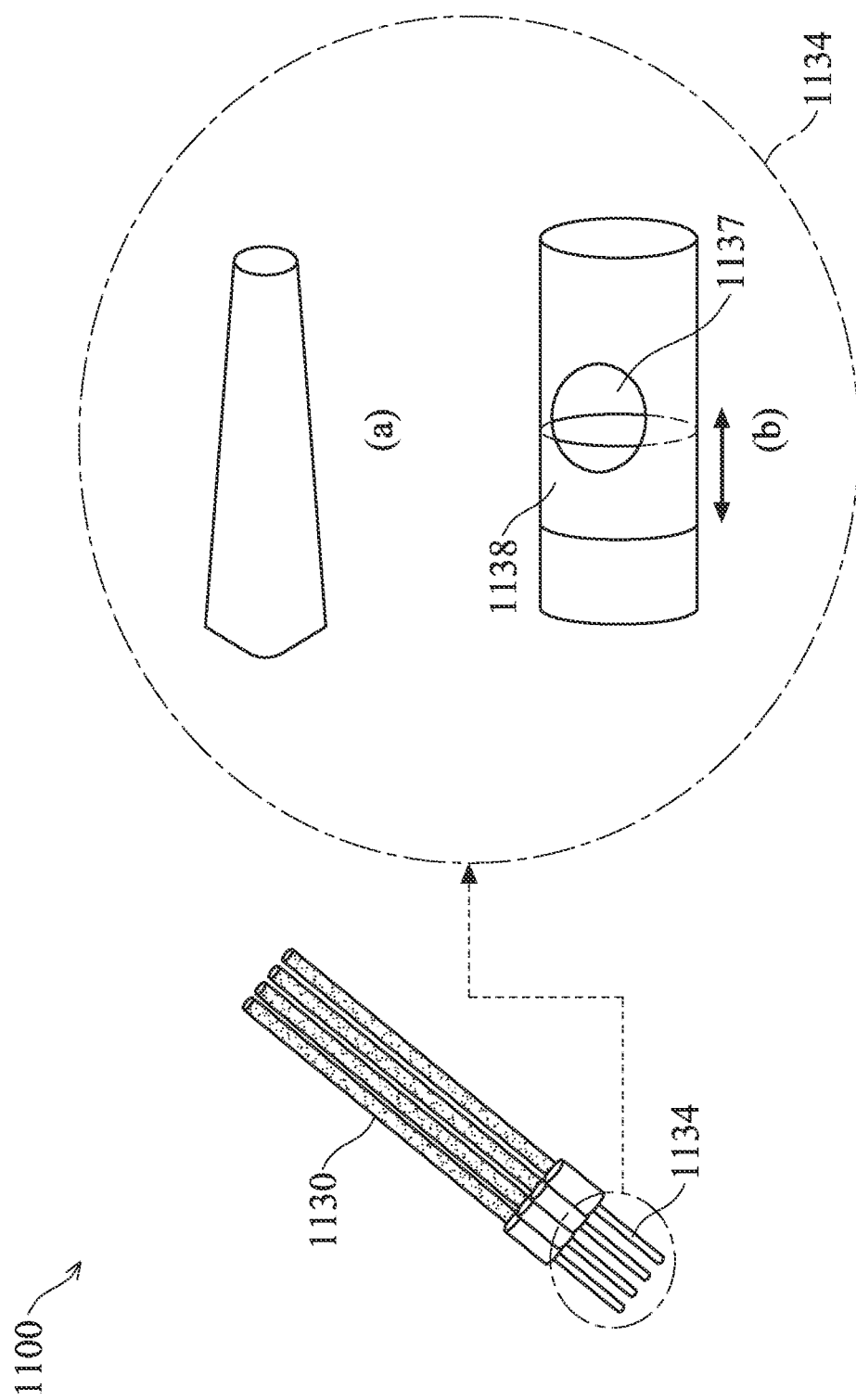
FIG. 3 schematically illustrates a flexible ejecting member including a front tip according to an embodiment.

FIG. 3 schematically shows a flexible ejecting member 1100 including various front tips 1134 according to embodiments of the disclosure. The cross-section of the front tip 1134 is not particularly limited. For example, in an embodiment, the shape of cross-section of the front tip 1134 is a circle, an ellipse, a triangle, and a regular or irregular convex polygon. In some embodiments, as shown in (a) of FIG. 3, the front tip 1134 includes a frustoconical shape. In other words, the front tip 1134 has a longitudinally tapering shape to provide a pressurized ejection of the fluid. The length of the one or more elongated tubes is not particularly limited. In some embodiments, a sleeve 1138 is slideably attached with the lateral openings 1137 of the flexible ejecting member 1100. In some embodiments, the sleeve 1138 is slideably disposed within the front tip 1134. In some embodiments, the flexible ejecting member 1100 has an adjustable orifice having a variable diameter of the front openings or the lateral openings 1137.

Referring back to FIGS. 2A and 2B, a user selects the front tip for the cleaning need and attaches the front tip to the elongated tube using the cleaning tip adapter. Then, the pressurized cleaning material 1080 is fluidly connected with and introduced into the flexible ejecting member 1100. The flexible ejecting member 1100 can then be introduced, by the user, into the unreachable dead zone 999 of the cup 960. The user moves the front openings or the lateral openings 1137 (shown in FIG. 2B) of the flexible ejecting member 1100 towards the contaminant material 850 located at the unreachable dead zone 999 in the curved portion 964 of the cup 960. Finally, the user may open a valve connecting the pressurized cleaning material 1080 to the flexible ejecting member 1100, and removes the contaminant material 850 from the unreachable dead zone 999 in the curved portion 964 of the cup 960.

Figure 4:
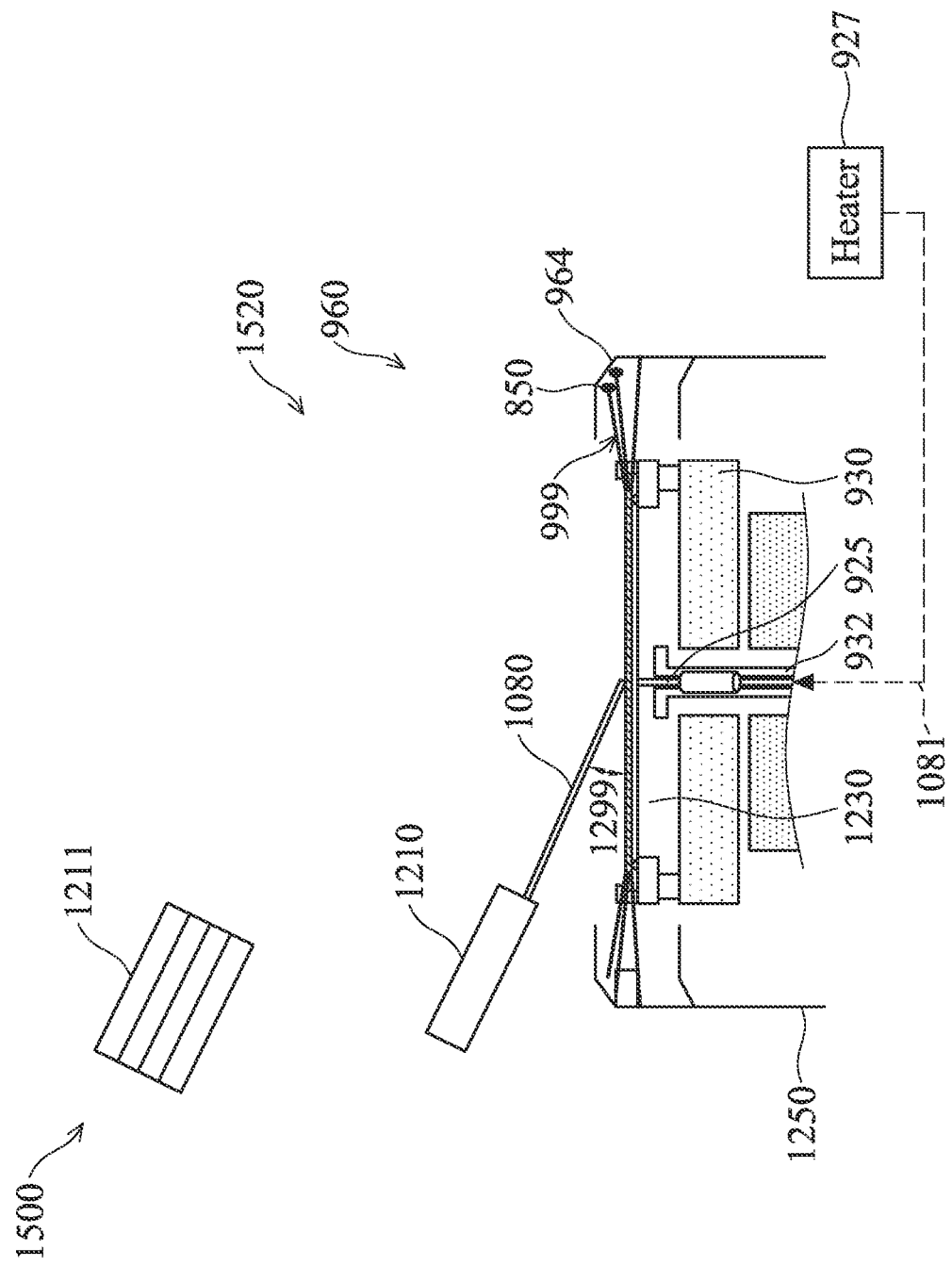
FIG. 4 schematically illustrates an automatic cup-cleaning operation in accordance with some embodiments of the disclosure.

In some embodiments, as shown in FIG. 4, an automatic cup-cleaning operation 1500 includes a cleaning operation 1520, a rinse operation 1540 (as shown in FIG. 7A), and a drying operation 1560 (as shown in FIG. 7B). The automatic cup-cleaning operation 1500 can be started automatically or manually by an operator's instruction. In some embodiments, the automatic cup-cleaning operation 1500 can be triggered by a pre-determined fixed time interval, such as 1 minute, 2 minutes, 5 minutes, 10 minutes, or the combination thereof, or after every N-wafers processed where N is 25, 50, 100 or any suitable number.

In some embodiments of the present disclosure, instead of or in addition to the manual cleaning as explained above, an automatic cleaning operation is employed. FIG. 4 shows a schematic illustration of an automatic cup-cleaning operation in accordance with some embodiments of the disclosure. Referring to FIG. 4, during the cleaning operation 1520, the particle removing assembly 1000 includes a dispensing nozzle 1210 for cup cleaning. In some embodiments, the dispensing nozzle 1210 is coupled to a moving and supporting mechanism and is connected to supporting devices such as a pump, a compressor, and connecting lines from the pump or the compressor to the dispensing nozzle 1210. In some embodiments, the dispensing nozzle 1210 is configured to eject the pressurized cleaning material 1080 with an incident angle 1299 between the pressurized cleaning material 1080 and an upper surface of a dummy disk 1230 to remove the contaminant material 850 from the unreachable dead zone 999 in the curved portion 964 of the cup 960. The particle removing assembly 1000 is configured to adjust the incident angle 1299 of the pressurized cleaning material 1080 such that the pressurized cleaning material 1080 is directed towards the unreachable dead zone 999 of the cup 960 by centrifugal force due to the rotation of the dummy disk 1230. When the pressurized cleaning material 1080 spun out by the dummy disk 1230 reaches the unreachable dead zone 999 of the cup 960, the pressurized cleaning material 1080 removes the contaminant material 850 at the unreachable dead zone 999 of the cup 960.

Figure 5B:
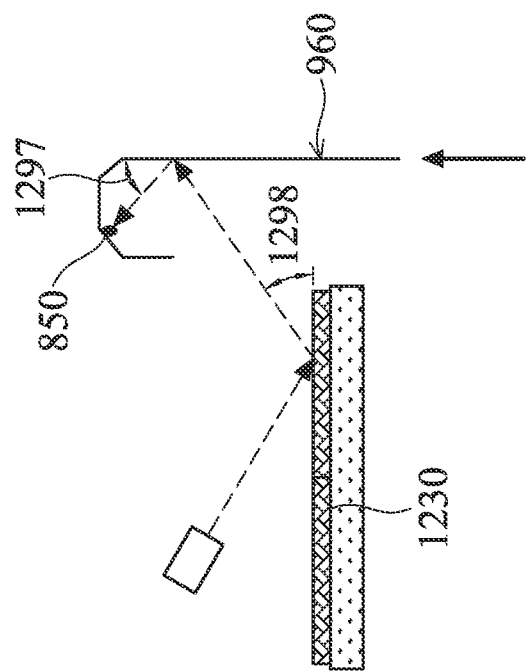
FIGS. 5A and 5B schematically illustrate a dispensing nozzle and a cup adjusting a height in a semiconductor wafer process according to an embodiment of the disclosure.
Figure 5A:
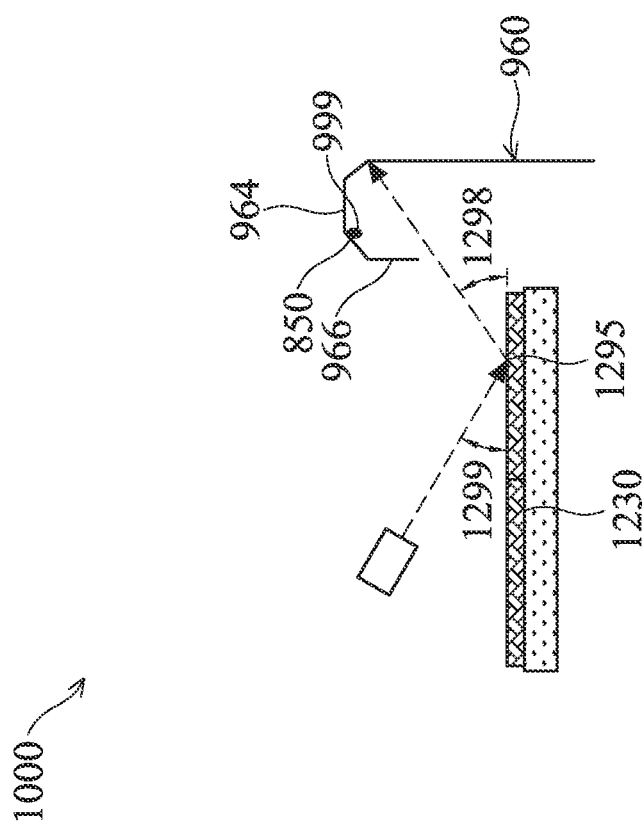

In some embodiments, as also shown in FIGS. 5A and 5B, the particle removing assembly 1000 is configured to adjust an incident point 1295, along a radius line on the surface of the dummy disk. In some embodiments, the incident point is the center of the dummy disk, and in other embodiments, the incident point is offset from the center of the disk by, for example 1-15 cm. In some embodiments, the particle removing assembly 1000 is configured to adjust a first reflective angle 1298 corresponding to the incident angle 1299 of the pressurized cleaning material 1080. In some embodiments, the dummy disk 1230 is a dummy wafer. In some embodiments, one or more dispensing nozzles 1211 may be provided to eject the pressurized cleaning material 1080. The dummy disk 1230 is disposed on the wafer chuck, and washes the cup 960 without detaching the cup from the semiconductor apparatus.

When a cup cleaning process is started, the dummy disk 1230 is placed on the wafer chuck 930 located within the cup 960. As shown in FIG. 4, the dispensing nozzle 1210 ejects the pressurized cleaning material 1080 onto the dummy disk 1230, while the wafer chuck 930 rotates the dummy disk 1230. The pressurized cleaning material 1080 on the dummy disk 1230 is reflected with the first reflective angle 1298, as shown in FIGS. 5A and 5B, of the pressurized cleaning material 1080 to the unreachable dead zone 999 of the cup 960 by a centrifugal force due to the rotation of the dummy disk 1230. Then, the pressurized cleaning material 1080 reflected by the dummy disk 1230 removes the contaminant material 850 at the unreachable dead zone 999 of the cup 960.

In some embodiments, the automatic cup-cleaning operation 1500 replaces the manual cleaning process. In such embodiments, the automatic cup-cleaning operation 1500 includes configurable parameters that include one or more of a type of fluids, spin speed, flow rate or pressure, a liquid temperature, a cup height with respect to the surface of the dummy disk, and/or the incidence angle 1299. The configurable parameters of the cup-cleaning operation 1500, according to some embodiments, further include control parameters to control the supporting devices.

In some embodiments, the particle removing assembly 1000 performs the cup-cleaning operation 1500 with a spin speed of the wafer chuck 930, holding the dummy disk 1230, from about 200 rpm to about 2500 rpm to remove the contaminant material 850 located in different portions of the curved portion 964 of the cup 960. The particle removing assembly 1000 is configured to perform the automatic cup-cleaning operation 1500 with an incidence angle 1299 of the pressurized cleaning material 1080 between the dispensing nozzle 1210 and the upper surface dummy disk 1230 in a range of between about 20 degrees to about 60 degrees. In some embodiments, the angle is fixed during the cleaning operation, and in other embodiments, the angle is changed within this range during the cleaning operation.

During the automatic cup-cleaning operation 1500, the dispensing nozzle 1210 ejects the pressurized cleaning material 1080 at a flow rate between about 1000 cc/min and about 2000 cc/min. In some embodiments, the flow rate is linearly adjusted by the controller between about 1000 cc/min to about 2000 cc/min. In alternative embodiments, the flow rate may be non-linearly adjusted by the controller between about 1000 cc/min to about 2000 cc/min. In some embodiments, the pressurized cleaning material 1080 includes at least one of pure water, $CO_2$ water, an alkaline solution (e.g., aqueous $NH_4OH$), an acid solution, and an organic solvent, or another suitable cleaning material.

In some embodiments, the cleaning and/or coating processes of the production is provided with the pressurized cleaning material 1081 that is heated and ejected from the backside nozzle 925 of the wafer stage as shown in FIG. 4. In some embodiments, the wafer chuck 930 includes a through hole 932. In the through hole 932, the backside nozzle 925 is located and connected to a heater 927. In such an embodiment, the heater 927 heats the pressurized cleaning material 1080 to a temperature in a range between about 20° C. to about 90° C. In some embodiments, the pressurized cleaning material 1080 also includes a flow rate in a range of between about 100 cc/min to about 2000 cc/min.

As shown in FIGS. 5A and 5B, during the automatic cup-cleaning operation 1500, the particle removing assembly 1000 adjust a height of the cup 960 to remove the contaminant material 850 from the unreachable dead zone 999 in the curved portion 964 of the cup 960. In some embodiments, as shown in FIG. 5A, various types of the cup 960 may be used and the curved portion 964 of the cup 960 may include different types of inclined/curved shapes 966 for the cleaning and/or coating processes of the wafer processing.

Due to the various sizes and configurations of the inclined/curved shape 966, complete removal of the contaminant material 850 that are adhered to the curved portion 964 of the cup 960 may be insufficient. Due to inclined/curved shape 966, the contaminant material 850 adhering to the unreachable dead zone 999 may be difficult to remove by adjusting the incident point 1295 and the first reflective angle 1298 corresponding to the incident angle 1299 of the pressurized cleaning material 1080 on the dummy disk 1230. According to an embodiment of the disclosure, the particle removing assembly 1000 adjusts the height of the cup 960 for cleaning the cup. For example, as shown in FIG. 5B, the particle removing assembly 1000 increases the height of the cup 960 such that the pressurized cleaning material 1080 is reflected again with a second reflective angle 1297. The pressurized cleaning material 1080 reflected by second reflective angle 1297 can reach the unreachable dead zone 999 and remove contaminant particles 850 from the unreachable dead zone 999 where it is difficult or near impossible to otherwise reach by adjusting the height of the cup 960. In some embodiments, during the automatic cup-cleaning operation 1500, the particle removing assembly 1000 includes a height adjustment of the cup 960 in a range between about 10 mm and about 50 mm.

In some embodiments, during the automatic cup-cleaning operation 1500, the pressurized cleaning material 1080 includes de-ionized water (DIW) or an organic solvent. In some embodiments, a temperature of the de-ionized water (DIW) is in a range between about 20° C. and about 90° C.

In some embodiments, the dispensing nozzle 1210 rotates around the cup to provide uniform cleaning to the cup.

Figure 6A:
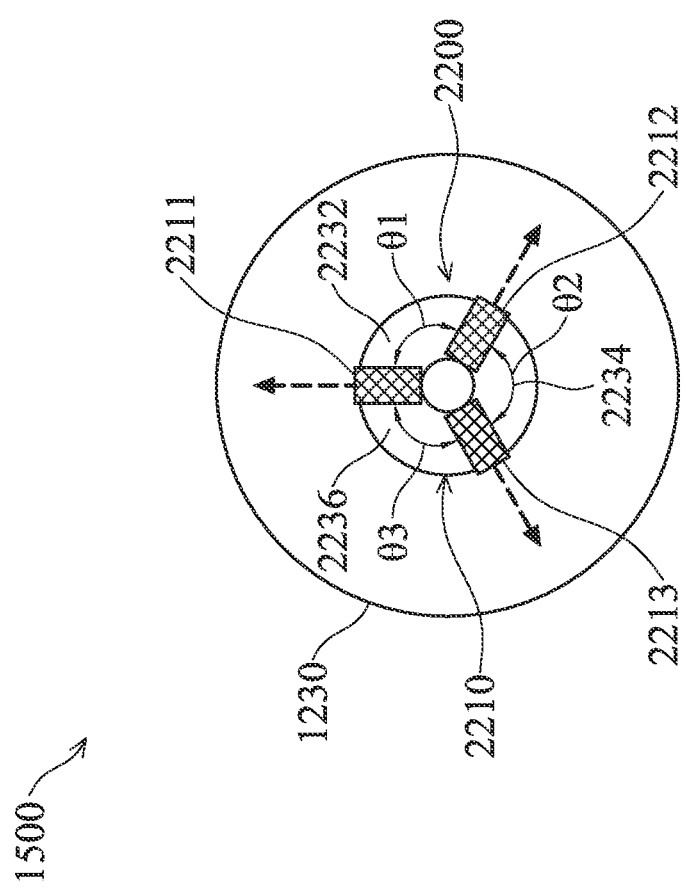
FIGS. 6A, 6B, 6C and 6D schematically illustrate some exemplary layouts of a dispensing nozzle structure according to various embodiments.

In other embodiments, the dispensing nozzle structure 2210 includes a plurality of dispensing nozzles 2200, as shown in FIG. 6A. In some embodiments, a plurality of dispensing nozzles 2200 are positioned within the dispensing nozzle structure 2210. During the automatic cup-cleaning operation 1500, the dispensing nozzle structure 2210 is positioned over the dummy disk 1230 and at or adjacent to a center of the dummy disk 1230. The dispensing nozzle structure 2210 includes the structure portions 2232, 2234, 2236 to provide a weight balancing mechanism between three dispensing nozzles 2211, 2212, 2213 such that the dispensing nozzle structure 2210 can rotate concentrically. The structure portions 2232, 2234, 2236 have a fan shape having central angles $\theta 1$, $\theta 2$, $\theta 3$. In some embodiments, the central angles $\theta 1$, $\theta 2$, $\theta 3$ are in a range from about 115 degrees to about 125 degrees. In some embodiments, central angles $\theta 1$, $\theta 2$, $\theta 3$ are the same. In some embodiments, the three dispensing nozzles 2211, 2212, 2213 of the dispensing nozzle structure 2210 are equally divided into three fan areas and at least one area extends angle $\theta=120$ degrees. In some embodiments, angles $\theta 1$, $\theta 2$, $\theta 3$ may be different.

Figure 6B:
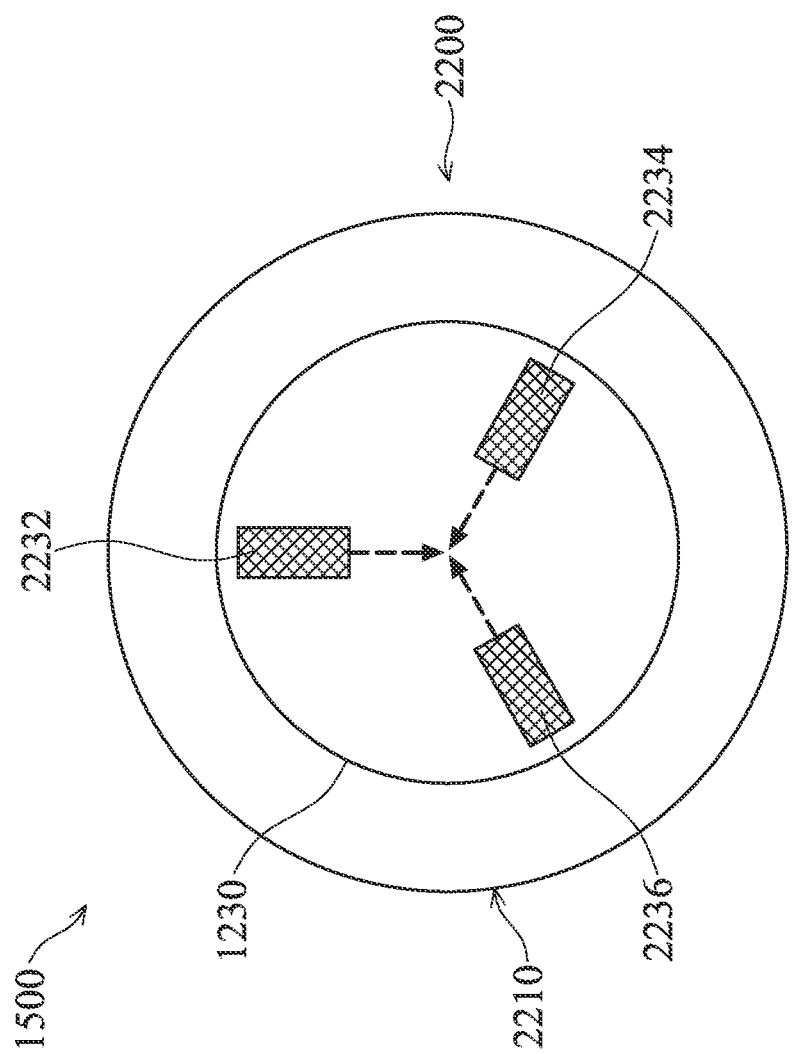

In some embodiments shown in FIG. 6B, the dispensing nozzle structure 2210 includes the structure portions 2232, 2234, 2236 with the three dispensing nozzles such that cleaning material is dispensed towards the center of the dummy disk 1230.

Figure 6C:
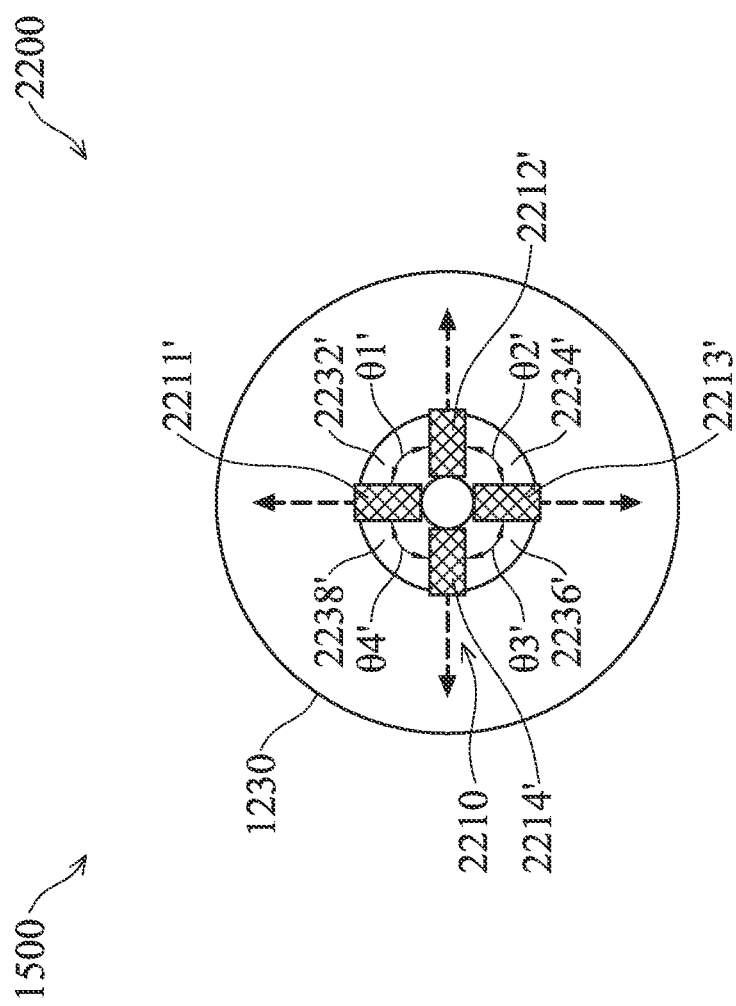

In some embodiments shown in FIG. 6C, the dispensing nozzle structure 2210 includes the structure portions 2232', 2234', 2236', 2238'. The structure portions 2232', 2234', 2236', 2238' have a fan shape having central angles $\theta 1'$, $\theta 2'$, $\theta 3'$, $\theta 4'$. In some embodiments, the central angles $\theta 1'$, $\theta 2'$, $\theta 3'$, $\theta 4'$ are in a range from about 85 degrees to about 95 degrees. In some embodiments, central angles $\theta 1'$, $\theta 2'$, $\theta 3'$, $\theta 4'$ are the same. In some embodiments, four dispensing nozzles 2211', 2212', 2213', 2214' of the plurality of dispensing nozzles 2200 are equally divided into four fan areas and at least one area extends angle $\theta=90$ degrees. In some embodiments, angles $\theta 1'$, $\theta 2'$, $\theta 3'$, $\theta 4'$ may be different.

Figure 6D:
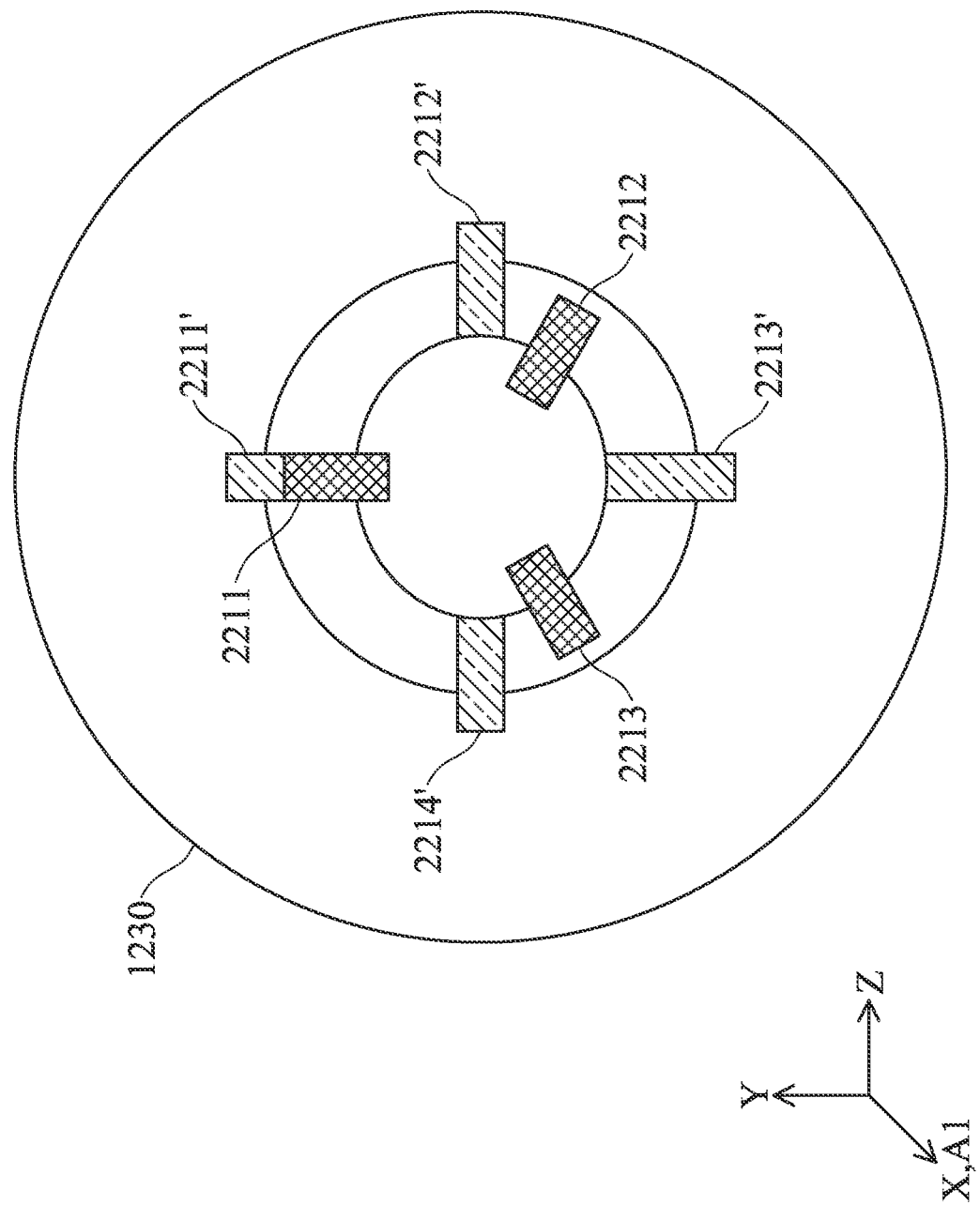

In other embodiments, as shown in FIG. 6D, the plurality of dispensing nozzles 2200 are stacked around an axis A1 perpendicular to the dummy disk 1230. In such embodiments, the three dispensing nozzles 2211, 2212, 2213 forming a first layer and the four dispensing nozzles 2211', 2212', 2213', 2214' forming a second layer are arranged such that the first layer and the second layer are stacked around the axis A1. In alternative embodiments, the four dispensing nozzles 2211', 2212', 2213', 2214' forming a first layer and the three dispensing nozzles 2211, 2212, 2213 forming a second layer are arranged such that the first layer and the second layer are stacked around the axis A1.

FIGS. 7A and 7B are schematic views of the rinse operation 1540 and the drying operation 1560 for rinsing and drying the unreachable dead zone 999 in the curved portion 964 of the cup 960, respectively. After an application of the cleaning material on the unreachable dead zone 999 is completed, the unreachable dead zone 999 is subjected to a rinsing operation to clean the unreachable dead zone 999. The rinse operation 1540 is carried out using the particle removing assembly 1000.

As shown in FIG. 7A, in some embodiments during the rinse operation 1540, rinsing fluid 124 is ejected from the dispensing nozzle 1210 and onto the upper surface of the dummy disk 1230 during the rinsing operation. The rinsing fluid 124 transforms a dry or partially wetted surface of the cleaning surface to a uniformly wetted cleaning surface. Simultaneously, the wafer chuck 930 holds and rotates the dummy disk 1230 at a predetermined rotational speed. The rinsing fluid 124 strikes the dummy disk 1230 and is drawn outward by centrifugal force toward the edge of the dummy disk 1230, rinsing the unreachable dead zone 999. In some embodiments, one or more additional nozzles, for example, the plurality of dispensing nozzles 2200 (shown in FIGS. 6A-6D) are used to dispense other cleaning agents on the unreachable dead zone 999 in the curved portion 964 of the cup 960.

Referring to FIG. 7B, in some embodiments, the drying operation 1560 uses an adjustable pattern (AP) nozzle 1310. The adjustable pattern (AP) nozzle 1310 rotates at a spin speed between about 900 rpm and about 2500 rpm, while the dummy disk 1230 stands still. In alternative embodiments, the adjustable pattern (AP) nozzle 1310 rotates at a non-linearly increasing spin speed between about 900 rpm and about 2500 rpm. In some embodiments, the adjustable pattern (AP) nozzle 1310 stands still, while the dummy disk 1230 rotates. The adjustable pattern (AP) nozzle 1310 is configured to provide a pressurized air stream 1384 from a center 1312 and/or two lateral sides 1314, 1316 of the AP nozzle. The AP nozzle 1310 includes a flow rate between about 10 liter/min and about 100 liter/min to dry the unreachable dead zone 999 in the curved portion 964 of the cup 960. During the drying operation 1560, the AP nozzle 1310, according to embodiments of the disclosure, is configured to provide a pressurized air stream 1384 such that the wafer maintains a relative humidity below about 25% across the surface of the wafer. In some embodiments, the AP nozzle 1310 is positioned at a height between about 1 mm and 3 mm above a center of the wafer. In some embodiments, the AP nozzle 1310 is positioned at a height of about 2 mm above the wafer center.

Figure 7C:
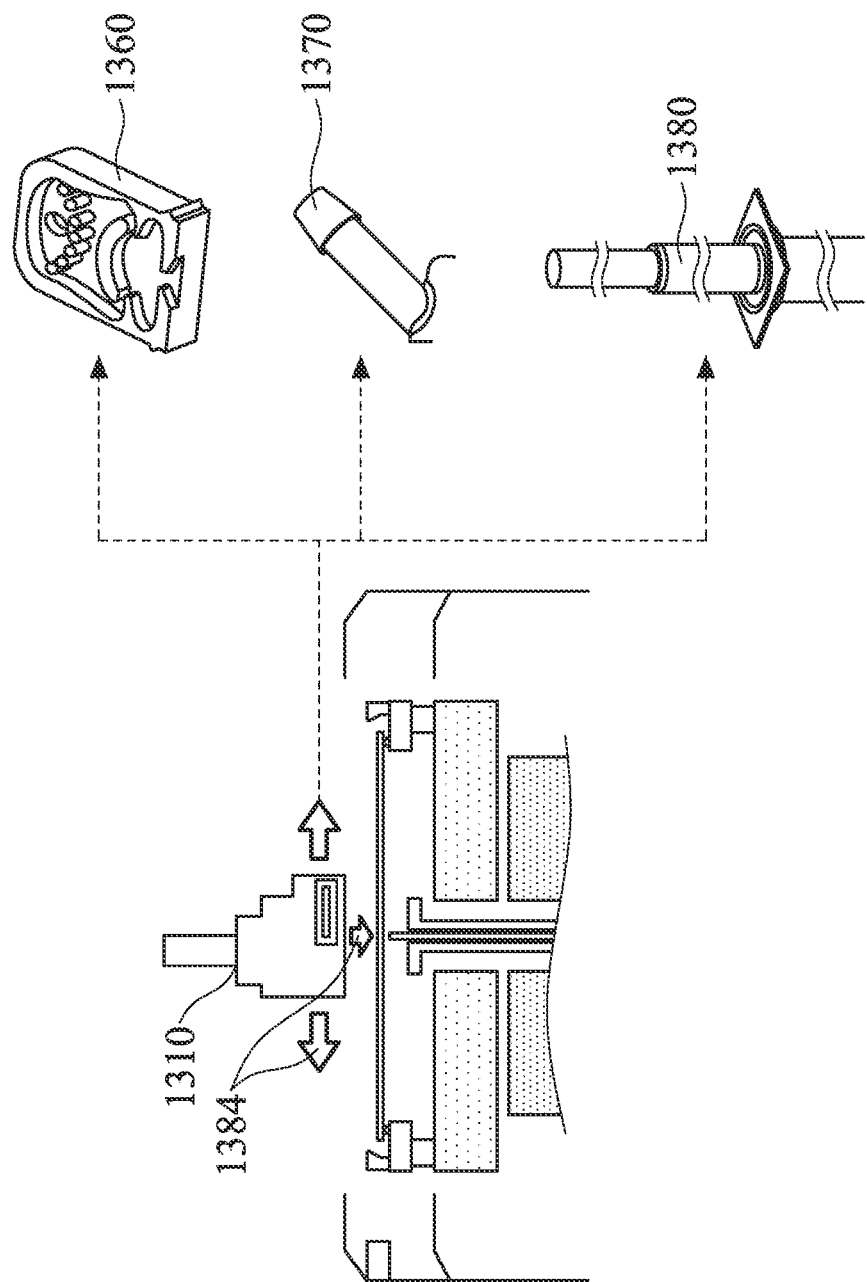

In some embodiments as shown in FIG. 7C, the AP nozzle 1310 further includes a pulsation insert 1360 and a directional insert 1370 to generate various patterns of the pressurized air stream 1384. The pulsation insert 1360 is configured to generate a pulsation/oscillation of the pressurized air stream 1384 by inserting a mechanical device into the AP nozzle 1310. The directional insert 1370 is configured to change a two-dimensional direction and/or three-dimensional rotation of the pressurized air stream 1384 by inserting a mechanical device into the AP nozzle 1310. In some embodiments, the AP nozzle 1310 further includes an extendable nozzle 1380. The extendable nozzle 1380 "pops-up" from the AP nozzle 1310 when needed and is substantially concealed within the AP nozzle 1310 when not in use. A controller 70 selectively enables a telescopingly extendable portion of the extendable nozzle 1380 in some embodiments. The telescopingly extendable portion includes a cylindrical body that is coaxially slideably received within the AP nozzle 1310 and has an inwardly projecting annular flange, which bears against any appropriate type of sealing. In some embodiments, the extendable nozzle 1380 is a 3-axis rotational device.

In some embodiments, the automatic cup-cleaning operation 1500 is triggered based on monitored and sensed contaminant particles.

Figure 8:
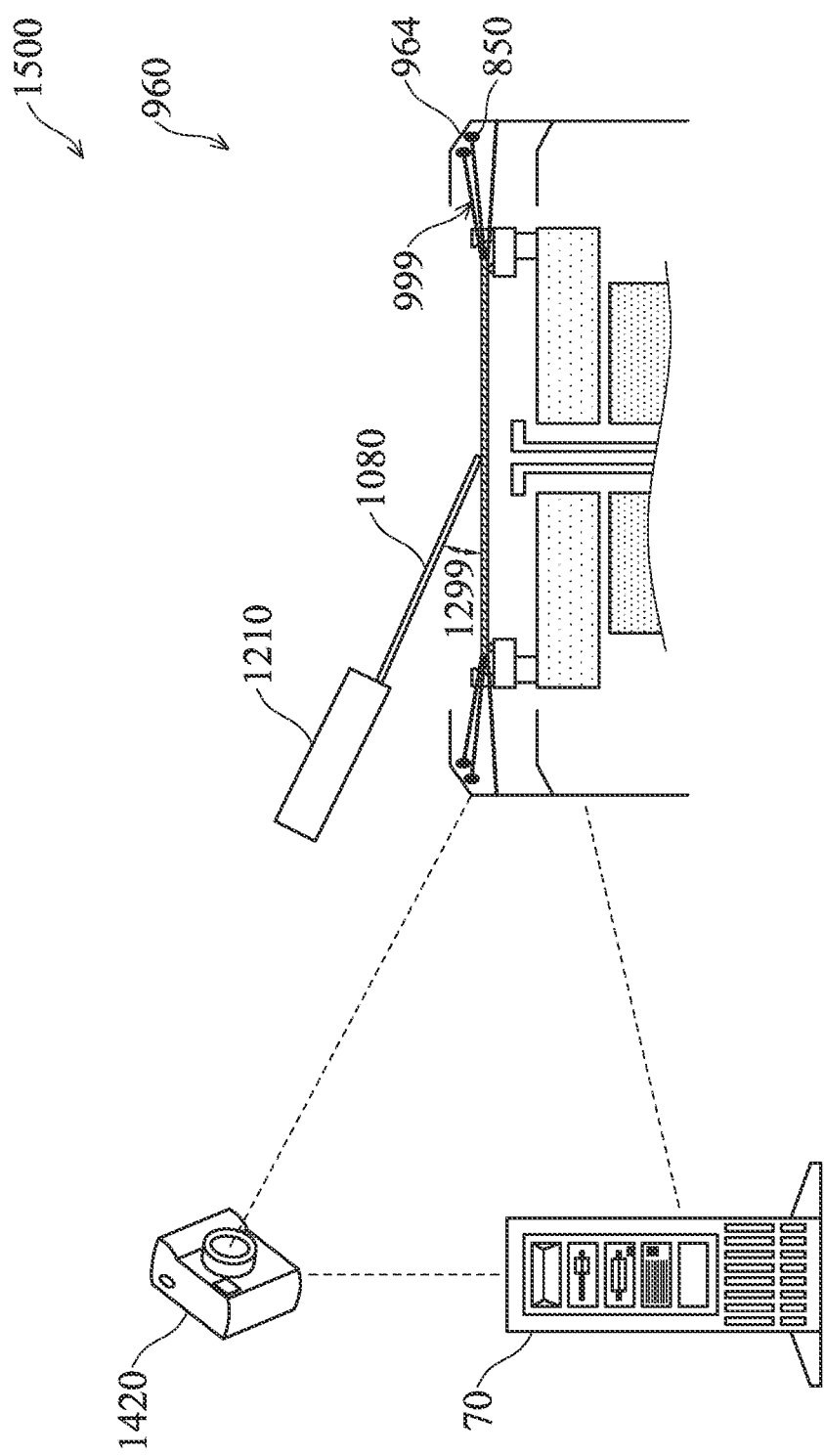
FIG. 8 schematically illustrates an automatic cup-cleaning operation in accordance with some embodiments of the disclosure.

As shown in FIG. 8, in some embodiments, a controller 70 is configured to monitor the contaminant material 850 at the unreachable dead zone 999 in the curved portion 964 of the cup 960. By using a monitoring device 1420, the controller 70 adjusts a configurable parameter when an amount of contaminant material 850 at the unreachable dead zone 999 is more than a threshold amount or greater than a threshold size, and regulates ejecting parameters of the pressurized cleaning material 1080 by operating the compressor and the pump when the pressurized cleaning material 1080 is ejected from the adjustable nozzle. In such embodiments, the automatic cup-cleaning operation 1500 includes configurable parameters that include one or more of a type of fluids, spin speed, flow rate, temperature and a cup distance, an incidence angle, etc. The configurable parameters of the cup-cleaning operation 1500, according to some embodiments, further include control parameters to control the supporting devices, such as a pump and a compressor. In some embodiments, the monitoring device 1420 is a camera. In some embodiments, the monitoring device 1420 includes an image process unit/algorithm using the camera. In some embodiments, the ejection of the pressurized cleaning material 1080 from the adjustable nozzle is stopped when the monitoring device detects the amount of the contaminant material 850 on the unreachable dead zone 999 in the curved portion 964 of the cup 960 is below the threshold amount. Any appropriate controlling configuration regarding automatic and/or manual operation is contemplated and is not limited in this regard.

The cleaning position of the particle removing assembly 1000 with respect to portions at the unreachable dead zone 999 of the cup 960 is programmed by the controller 70 according to different cleaning recipes. For example, the cleaning position may be programmed with an incident angle of the pressurized cleaning material 1080 of about 45 degrees. After positioning the dispensing nozzle 1210 to the cleaning position (the 45 degree configuration of the processing apparatus 10), the nozzle positioner stops moving. The pressurized cleaning material 1080 then cleans the unreachable dead zone 999 in the curved portion 964 of the cup 960 until the end of the cleaning operation 1520.

Figure 9:
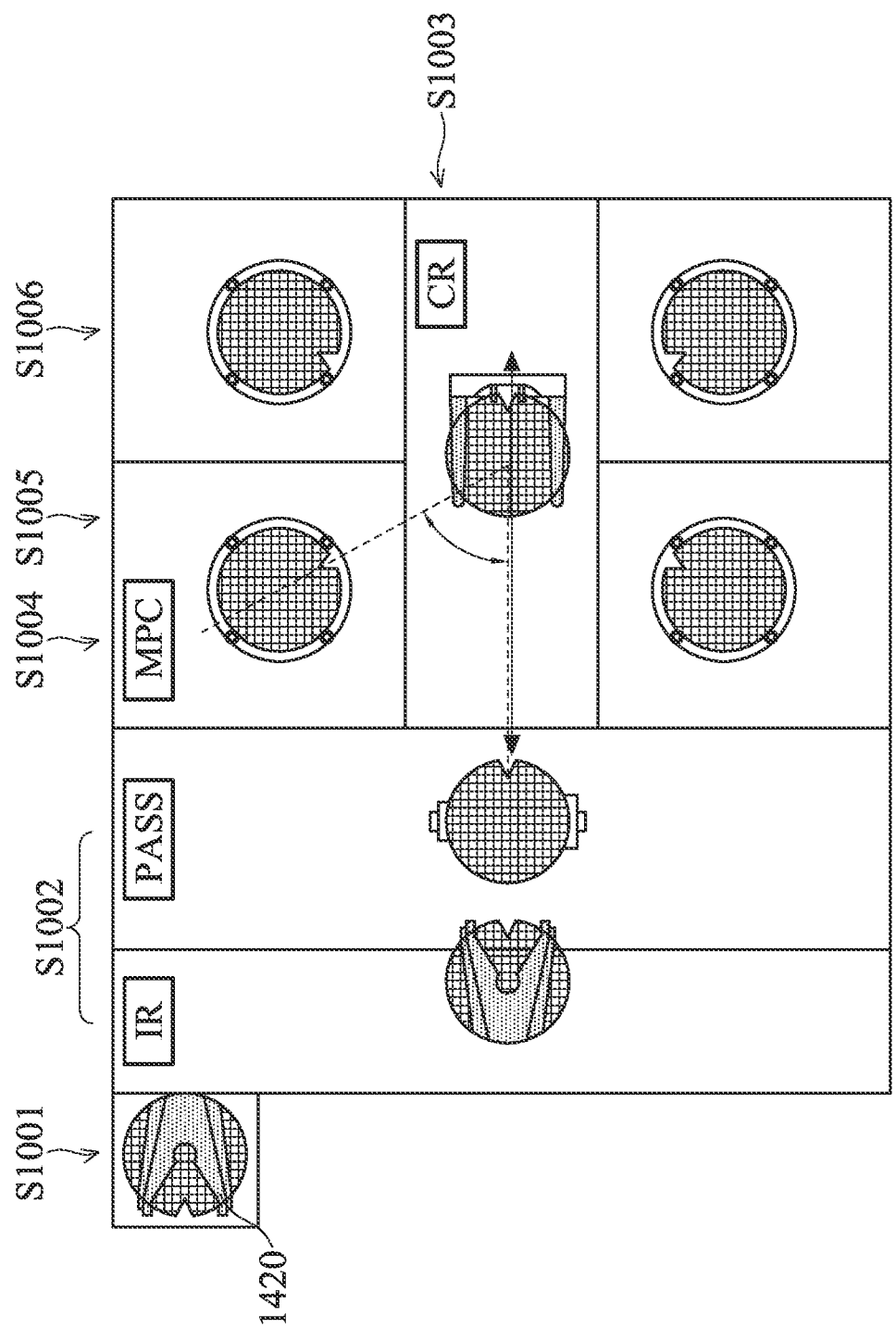
FIG. 9 shows a schematic view of automatic cup cleaning recipe schemes of a particle removing assembly.

FIG. 9 shows show an automatic cup cleaning recipe scheme for cleaning the unreachable dead zone in the curved portion wall of the cup for a wet process apparatus according to an embodiment of the disclosure. An exemplary cleaning recipe according to embodiments of the disclosure is as follows: in operation S1001, the wafer handler 1420 holds the dummy disk 1230 where a notch is oriented in an entry direction. In operation S1002, the dummy disk is transferred from an indexer robot IR to a substrate platform PASS while rotating the dummy disk opposite from the entry direction. In operation S1003, the dummy disk is transferred from the substrate platform PASS into a central robot CR. In operation S1004, the dummy disk moves into one of the chambers MPC and is rotated by a predetermined angle. The particle removing assembly brings up the pressurized cleaning material and cleans the unreachable dead zone in the curved portion wall of the cup. In operation 51005, the particle removing assembly changes the pressurized cleaning material and cleans the unreachable dead zone in the curved portion wall of the cup ranging from about 20° C. to about 90° C. In operation S1006, the particle removing assembly 1000 switches the cup position. In operation S1006, the particle removing assembly dries the cup and the chamber. After the cleaning of a chamber MPC is completed, the dummy disk is transferred to another chamber MPC for a cleaning operation.

During this automatic cup-cleaning operation 1500, the cleaning recipe scheme repeats steps i) providing different fluids to clean the cup at a temperature of from 25~90° C., (ii) adjusting the cup position, and (iii) using the AP nozzle 1310 to dry the cup and chamber.

Figure 10A:
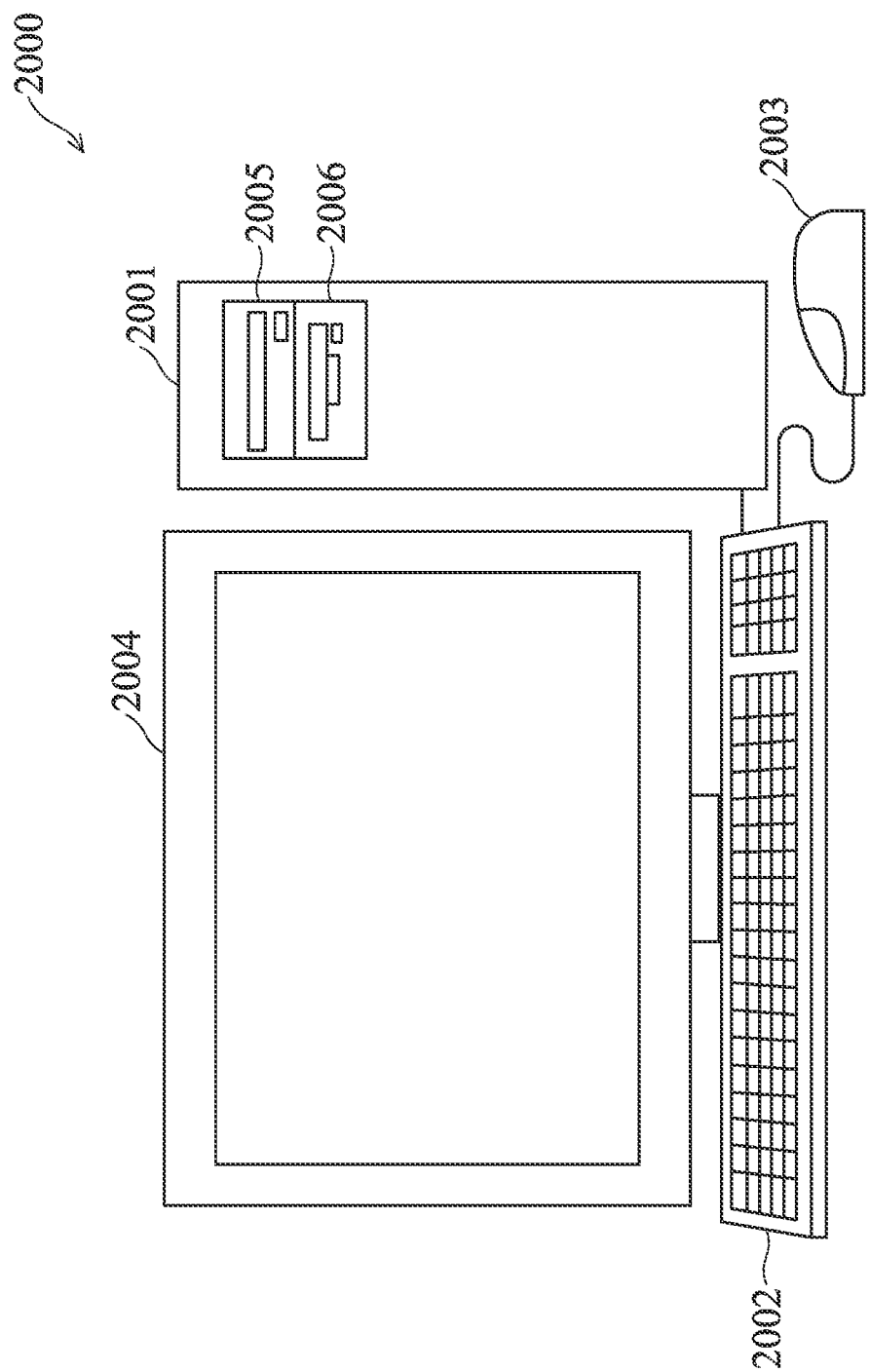
FIGS. 10A and 10B illustrate a controller in accordance with some embodiments of the disclosure.
Figure 10B:
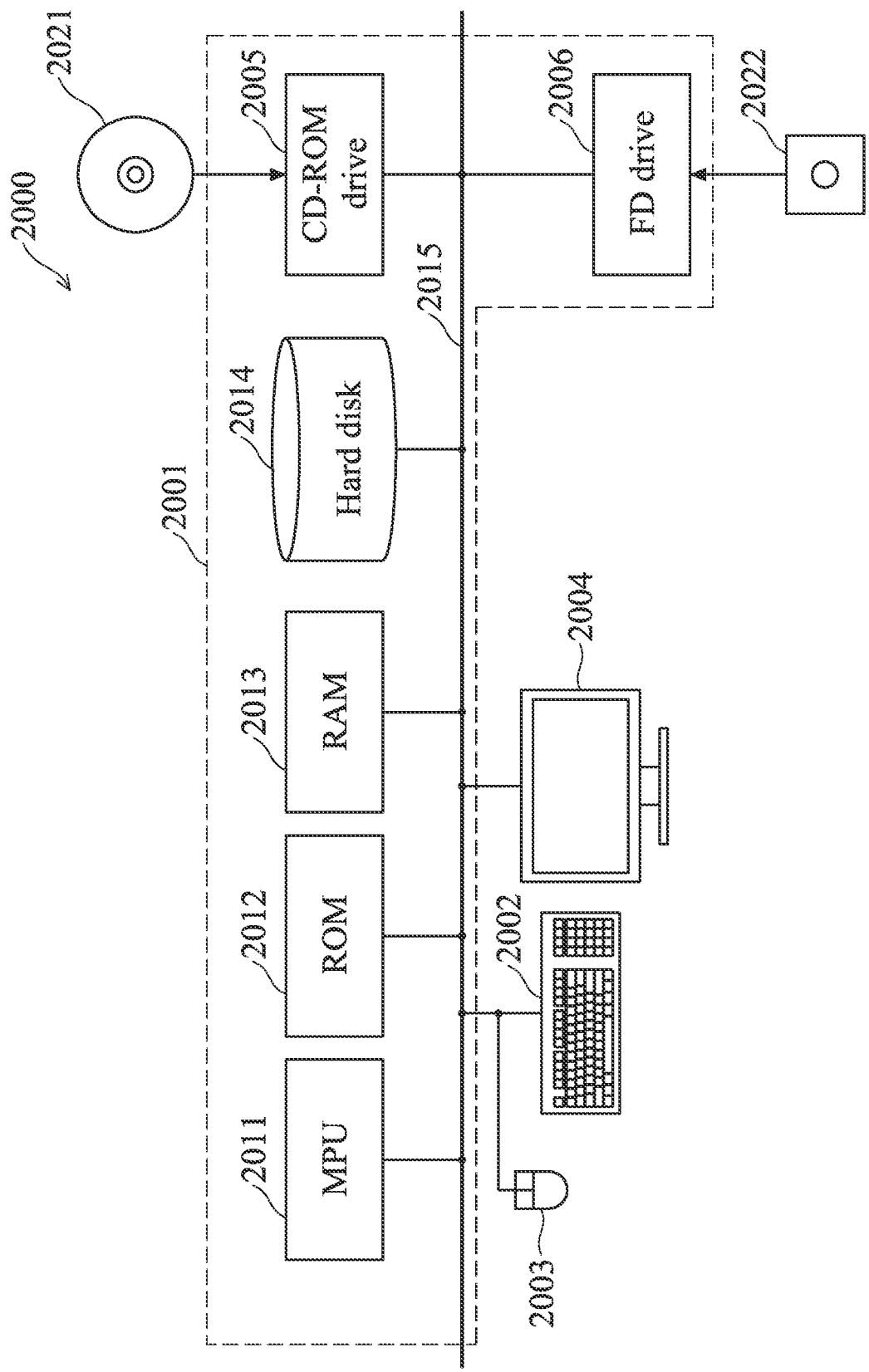

FIGS. 10A and 10B illustrate a configuration of the controller 70 in accordance with some embodiments of the disclosure. In some embodiments, a computer system 2000 is used as the controller 70. In some embodiments, the computer system 2000 performs the functions of the controller as set forth above.

FIG. 10A is a schematic view of a computer system. All of or a part of the processes, method and/or operations of the foregoing embodiments can be realized using computer hardware and computer programs executed thereon. In FIG. 10A, a computer system 2000 is provided with a computer 2001 including an optical disk read only memory (e.g., CD-ROM or DVD-ROM) drive 2005 and a magnetic disk drive 2006, a keyboard 2002, a mouse 2003, and a monitor 2004.

FIG. 10B is a diagram showing an internal configuration of the computer system 2000. In FIG. 10B, the computer 2001 is provided with, in addition to the optical disk drive 2005 and the magnetic disk drive 2006, one or more processors, such as a micro processing unit (MPU) 2011, a ROM 2012 in which a program such as a boot up program is stored, a random access memory (RAM) 2013 that is connected to the MPU 2011 and in which a command of an application program is temporarily stored and a temporary storage area is provided, a hard disk 2014 in which an application program, a system program, and data are stored, and a bus 2015 that connects the MPU 2011, the ROM 2012, and the like. Note that the computer 2001 may include a network card (not shown) for providing a connection to a LAN.

The program for causing the computer system 2000 to execute the functions of an apparatus for controlling the apparatus in the foregoing embodiments may be stored in an optical disk 2021 or a magnetic disk 2022, which are inserted into the optical disk drive 2005 or the magnetic disk drive 2006, and transmitted to the hard disk 2014. Alternatively, the program may be transmitted via a network (not shown) to the computer 2001 and stored in the hard disk 2014. At the time of execution, the program is loaded into the RAM 2013. The program may be loaded from the optical disk 2021 or the magnetic disk 2022, or directly from a network. The program does not necessarily have to include, for example, an operating system (OS) or a third party program to cause the computer 2001 to execute the functions of the controller 70 in the foregoing embodiments. The program may only include a command portion to call an appropriate function (module) in a controlled mode and obtain desired results.

Embodiments of the present disclosure provide a cleaner cup with reduced contamination. Embodiments of the present disclosure further provide the benefit of reducing downtime during maintenance and servicing photolithographic tools and masks. The design of the cleaning system and particle removing assembly allows for faster maintenance with reduced servicing time. The adaptation of the cleaning system allows an improved process resulting in reduced manpower required to perform the maintenance, and an increased output of conforming servicing items of the photolithographic tools—both of which ultimately result in a cost-savings. As such, the photolithographic tools and masks are more efficiently used. However, it will be understood that not all advantages have been necessarily discussed herein, no particular advantage is required for all embodiments or examples, and other embodiments or examples may offer different advantages.

An embodiment of the disclosure is a method of cleaning a cup used in a wet process apparatus. The method includes providing a cup adjacent to a wafer chuck within a chamber, the cup configured to guard contaminant material against spreading into the chamber. Then, a particle removing assembly configured to remove contaminant material from the cup having an unreachable area from a linear fluidic access caused by a curvature of the cup. The particle removing assembly comprises a flexible ejecting member including one or more elongated tubes and a front tip. The front tip includes at least one of a front opening or a lateral opening, from which pressurized cleaning material is ejected. The cleaning tip adapter is configured to attach the front tip to each of the one or more elongated tubes. Then, the flexible ejecting member is positioned to face the unreachable area of the cup. Subsequently, the pressurized cleaning material is ejected through the front opening with a first diameter or the lateral opening with a second diameter to remove the contaminant material from the unreachable area of the cup. Finally, the by the flexible ejecting member rinses unreachable area of the cup.

In some embodiments, the front tip detachable from the one or more elongated tubes is replaced with an L-shaped front tip. In some embodiments, the front tip that includes the front opening with a third diameter is replaced. In some embodiments, the particle removing assembly further includes a cleaning tip adapter that is configured to attach the front tip to each of the one or more elongated tubes. In some embodiments, the one or more elongated tubes is monolithic unit including the front tip fixedly attached or integrated with an elongated tube body. In some embodiments, the flexible ejecting member is made of polyethylene (PE) or polytetrafluoroethylene (PTFE).

Another embodiment of the disclosure is an apparatus for cleaning a cup. The apparatus includes a cup adjacent to a wafer chuck to guard contaminant material against spreading into a chamber, a particle removing assembly, and a controller communicating with the particle removing assembly. The particle removing assembly is configured to remove contaminant material from the cup. The particle removing assembly includes a dispensing nozzle and a drying nozzle. The particle removing assembly includes a dispensing nozzle and a drying nozzle. The dispensing nozzle is configured to eject pressurized cleaning material towards an incident point along with an incident angle between the pressurized cleaning material and a dummy wafer, so that the pressurized cleaning material is reflected off the dummy wafer to an unreachable area from a linear fluidic access introduced by a curvature of the cup by rotating force. The controller is configured to determine whether a variation in an amount of contaminant material in the unreachable area of the cup is within an acceptable range, and control the particle removing assembly such that the variation in an amount of contaminant material in the unreachable area of the cup is within the acceptable range during a cup cleaning operation.

In some embodiments, in response to a determination that a detected variation in the amount of contaminant material is not within an acceptable range, the controller automatically adjusts a configurable parameter of the particle removing assembly. In some embodiments, the controller controls the wafer chuck to rotate at a spin speed between 200 rpm and 2500 rpm during the cup cleaning operation. In some embodiments, the dispensing nozzle ejects the pressurized cleaning material with an angle of incidence between a dispensing nozzle and an upper surface of the dummy wafer in a range of between 20 degrees to 60 degrees. In some embodiments, the cup cleaning operation is triggered automatically by a pre-determined fixed time interval. In some embodiments, the dispensing nozzle ejects the pressurized cleaning material in a flow rate between 1000 cc/min and 2000 cc/min. In some embodiments, the apparatus further includes a heater to heat the pressurized cleaning material. In some embodiments, the heater is configured to eject the heated cleaning material from a center of the wafer stage. In some embodiments, during the cup-cleaning operation, the controller is configured to set a flow rate of the pressurized cleaning material in a range of between 100 cc/min and 2000 cc/min. In some embodiments, the monitoring device is a camera. In some embodiments, the controller is configured to set a height adjustment of the cup in a range between about 10 mm and about 50 mm.

According to another aspect of the present disclosure is a method of cleaning a cup in a wet process apparatus. The wet process apparatus includes a cup adjacent to a wafer chuck within a chamber and a particle removing assembly configured to remove contaminant material from the cup. The particle removing assembly includes a nozzle and a drying nozzle. The nozzle is configured to eject pressurized cleaning material onto a dummy wafer, so that the pressurized cleaning material is reflected off the dummy wafer to an unreachable area introduced by a curvature of the cup by rotating force. The method includes ejecting the pressurized cleaning material through a dispensing nozzle. Then, the unreachable area of the cup is rinsed. Subsequently, the unreachable area of the cup is dried by the drying nozzle.

In some embodiments, the contaminant material at the unreachable area of the cup is monitored by a monitoring device. In some embodiments, a configurable parameter of the particle removing assembly is adjusted. In some embodiments, the pressurized cleaning material is at least one of de-ionized water (DIW) and an organic solvent. The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for cleaning a cup, comprising:
the cup adjacent to a wafer chuck to guard contaminant material against spreading into a chamber, wherein the cup includes a first vertical wall and a second vertical wall, and a curvature of the cup connects the first and second vertical walls;
a particle removing assembly configured to remove contaminant material from the cup, wherein the particle removing assembly comprises:
a dispensing nozzle configured to eject pressurized cleaning material towards an incident point at an incident angle between the pressurized cleaning material and a dummy wafer, so that the pressurized cleaning material is reflected off the dummy wafer towards a surface of the second vertical wall and reflected again off the surface of the second vertical wall to reach an unreachable area of the curvature of the cup, and
a drying nozzle; and
a programmed computer communicating with the particle removing assembly, wherein the programmed computer is configured to:
determine, by a monitoring device, whether a variation in an amount of contaminant material in the unreachable area of the cup is within an acceptable range, and
control the particle removing assembly such that the variation in an amount of contaminant material in the unreachable area of the cup is within the acceptable range during a cup cleaning operation.

2. The apparatus of claim 1, wherein the programmed computer automatically adjusts, in response to a determination that a detected variation in the amount of contaminant material is not within an acceptable range, a configurable parameter of the particle removing assembly.

3. The apparatus of claim 2, wherein the configurable parameter includes one or more of a type of fluids, spin speed, flow rate or pressure, a liquid temperature, a cup height with respect to a surface of a dummy disk, and the incident angle.

4. The apparatus of claim 1, wherein the programmed computer controls the wafer chuck to rotate at a spin speed between 200 rpm and 2500 rpm during the cup cleaning operation.

5. The apparatus of claim 1, wherein the incident angle between the pressurized cleaning material and the dummy wafer is in a range of between 20 degrees to 60 degrees.

6. The apparatus of claim 1, wherein the cup cleaning operation is triggered automatically by a pre-determined fixed time interval.

7. The apparatus of claim 1, wherein the dispensing nozzle ejects the pressurized cleaning material in a flow rate between 1000 cc/min and 2000 cc/min.

8. The apparatus of claim 7, wherein the monitoring device is a camera.

9. The apparatus of claim 1, wherein, during the cup cleaning operation, the programmed computer is configured to set a flow rate of the pressurized cleaning material in a range of between 100 cc/min and 2000 cc/min.

10. The apparatus of claim 1, wherein the programmed computer is configured to set a height adjustment of the cup in a range between about 10 mm and about 50 mm.

11. An apparatus for cleaning a cup, comprising:
a wafer chuck configured to hold a dummy wafer adjacent to the cup in a chamber; and
a particle removing assembly configured to remove contaminant material from the cup,
wherein the cup includes a first vertical wall and a second vertical wall, and a curvature of the cup connects the first and second vertical walls,
wherein the particle removing assembly comprises a dispensing nozzle configured to eject pressurized cleaning material at an incident angle between the pressurized cleaning material and the dummy wafer in a range of between 20 degrees to 60 degrees, so that the pressurized cleaning material is reflected off the dummy wafer towards a surface of the second vertical wall and reflected again off the surface of the second vertical wall to reach an unreachable area of the curvature of the cup.

12. The apparatus of claim 11, further comprising a programmed computer configured to communicate with the particle removing assembly.

13. The apparatus of claim 12, wherein the programmed computer is configured to determine, by a monitoring device, whether a variation in an amount of the contaminant material in the unreachable area of the cup is within an acceptable range.

14. The apparatus of claim 13, wherein the programmed computer is configured to control the particle removing assembly so that the variation in the amount of the contaminant material in the unreachable area of the cup is within the acceptable range during a cup cleaning operation.

15. The apparatus of claim 13, wherein the monitoring device is a camera.

16. The apparatus of claim 11, wherein the particle removing assembly further comprises a drying nozzle.

17. A particle removing assembly for removing contaminant material from a cup, comprising:
a dispensing nozzle configured to eject pressurized cleaning material onto a dummy wafer,
wherein the cup includes a first vertical wall and a second vertical wall, and a curvature of the cup connects the first and second vertical walls,
wherein the cup is disposed adjacent to a wafer chuck to guard the contaminant material against spreading into a chamber, and
wherein the dispensing nozzle is configured to eject pressurized cleaning material at an incident angle between the pressurized cleaning material and the dummy wafer in a range of between 20 degrees to 60 degrees so that the pressurized cleaning material is reflected off the dummy wafer towards a surface of the second vertical wall and reflected again off the surface of the second vertical wall to reach an unreachable area of the curvature of the cup; and
a drying nozzle.

18. The particle removing assembly of claim 17, wherein the dummy wafer is rotated by the wafer chuck.

19. The particle removing assembly of claim 17, wherein the pressurized cleaning material ejected by the dispensing nozzle is in a flow rate between 1000 cc/min and 2000 cc/min.

20. The particle removing assembly of claim 17, wherein the drying nozzle is an adjustable pattern nozzle.

* * * * *